United States Patent [19]

Evans

[11] Patent Number: 4,603,928

[45] Date of Patent: Aug. 5, 1986

[54] BOARD TO BOARD EDGE CONNECTOR

[75] Inventor: William R. Evans, Mooresville, N.C.

[73] Assignee: AMP Incorporated, Harrisburg, Pa.

[21] Appl. No.: 713,970

[22] Filed: Mar. 20, 1985

[51] Int. Cl.⁴ .................... H01R 9/09; H01R 13/63.5
[52] U.S. Cl. ............................ 339/17 LM; 339/74 R
[58] Field of Search ............ 339/17 M, 17 LM, 74 R, 339/75 MP

[56] References Cited

U.S. PATENT DOCUMENTS

| | | | |
|---|---|---|---|
| 4,421,372 | 12/1983 | Golden | 339/75 MP |
| 4,488,766 | 12/1984 | Cosmo | 339/75 MP |
| 4,518,210 | 5/1985 | Morrison | 339/17 LM |

Primary Examiner—Neil Abrams
Attorney, Agent, or Firm—Robert W. Pitts

[57] ABSTRACT

A zero insertion force board to board edge connector for use with orthogonal printed circuit boards includes two mutually laterally shiftable camming members with a connecting element mounted on one camming member in opposition to conductive paths on the printed circuit boards. The camming and connecting members are laterally insertable and removable from a channel in a housing attached to one printed circuit board. The connecting element includes conductive traces which can be carried on a dielectric film and an elastomeric member biasing the conductive traces into engagement with the conductive paths.

13 Claims, 12 Drawing Figures

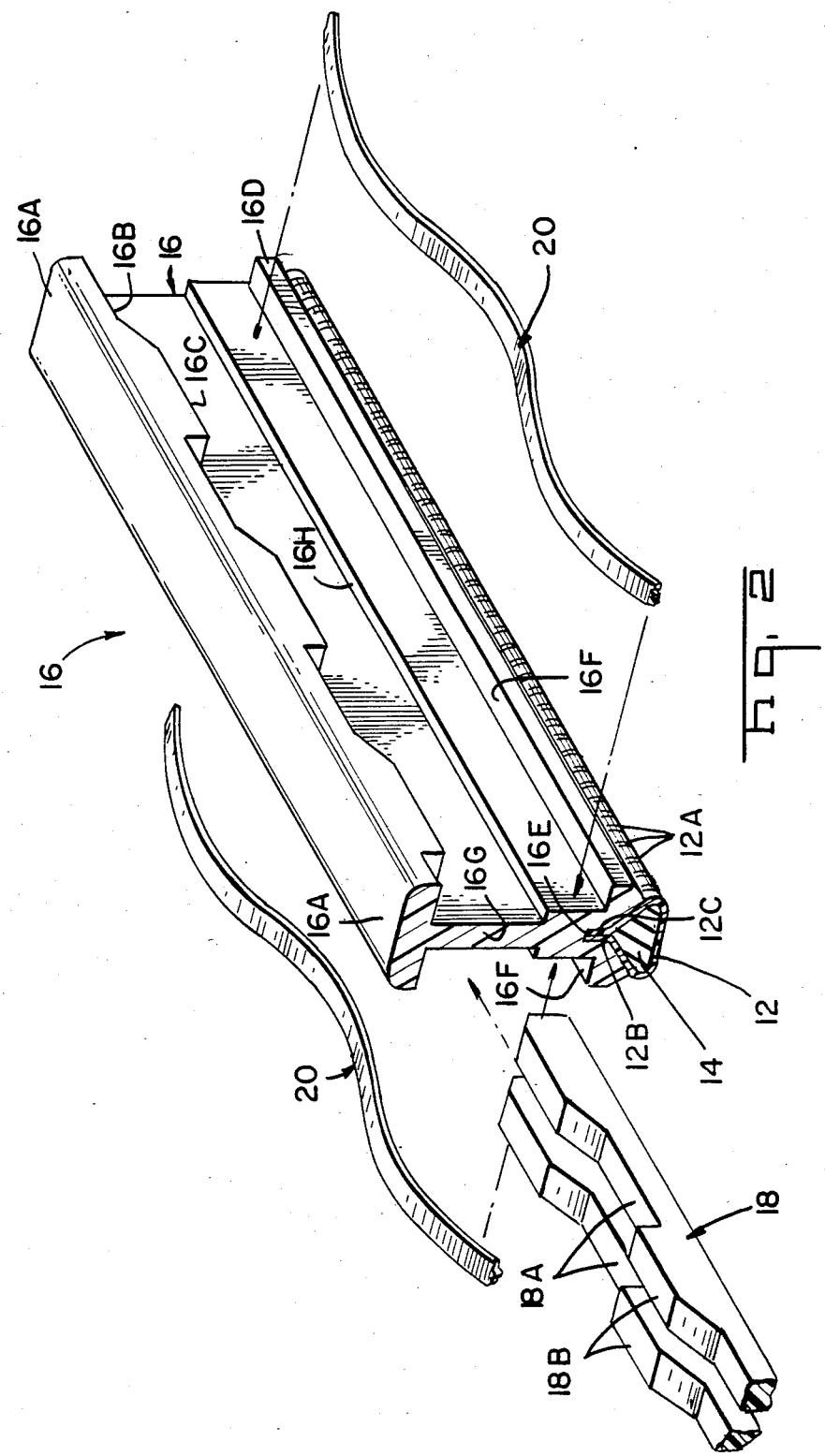

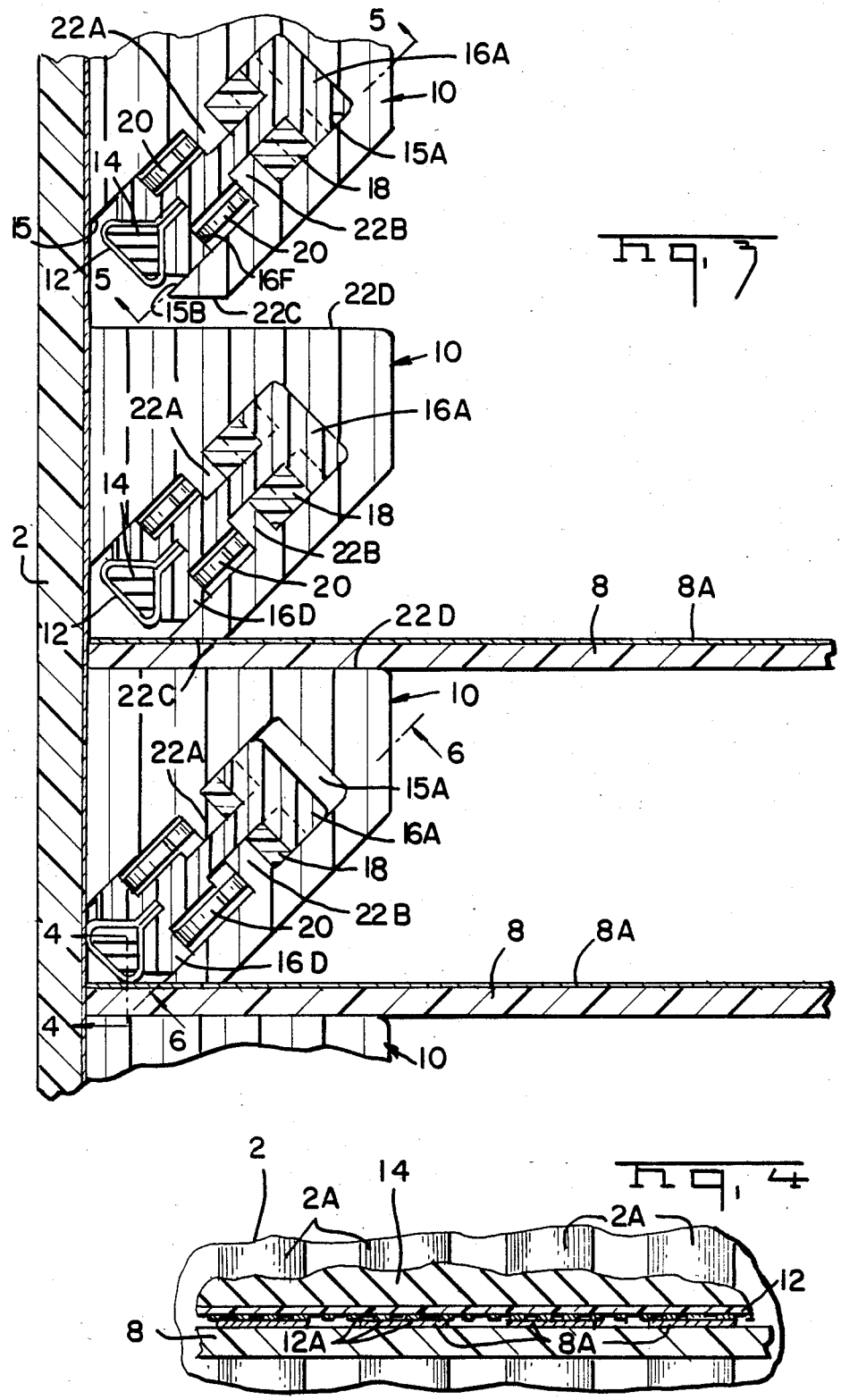

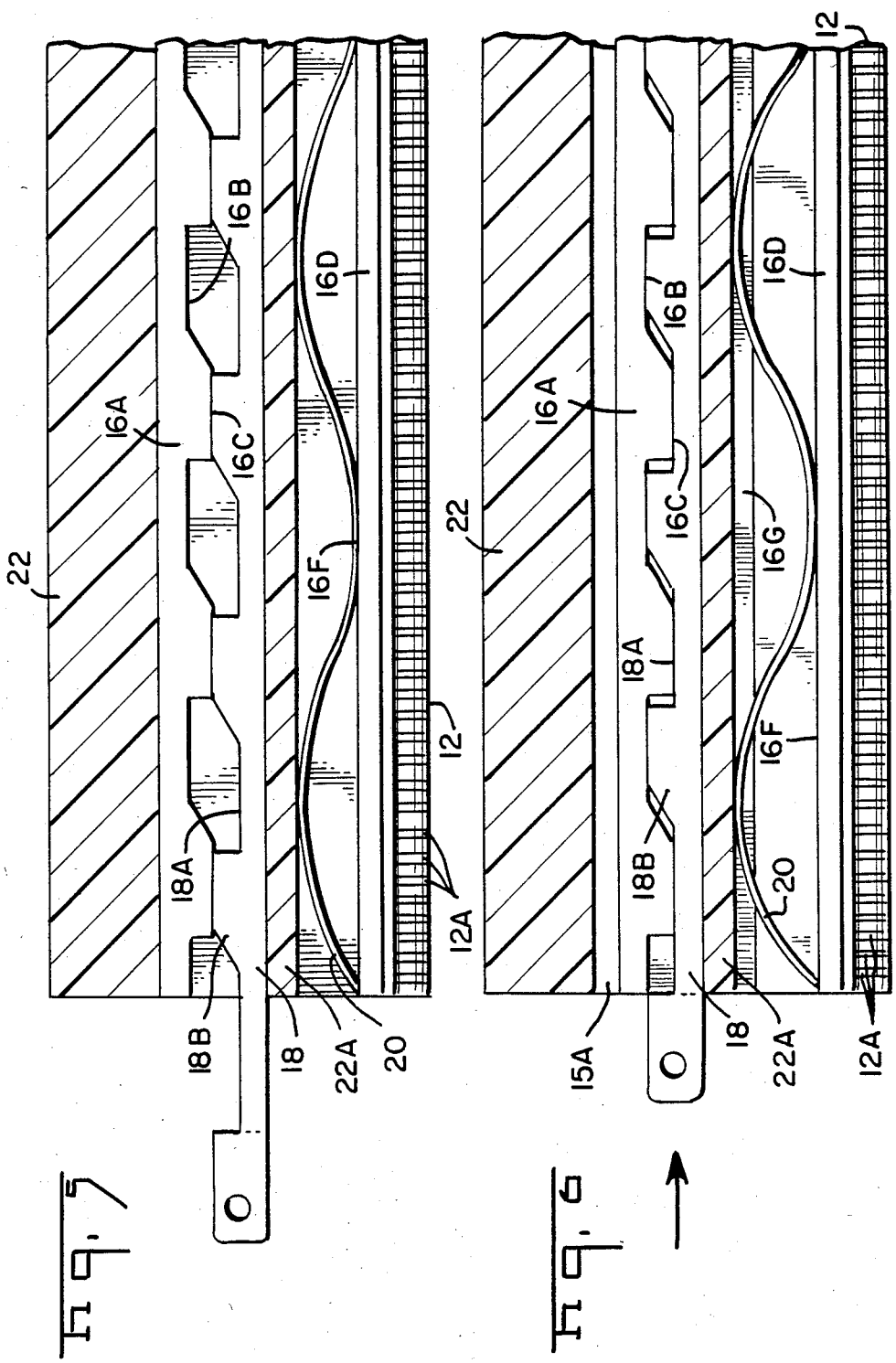

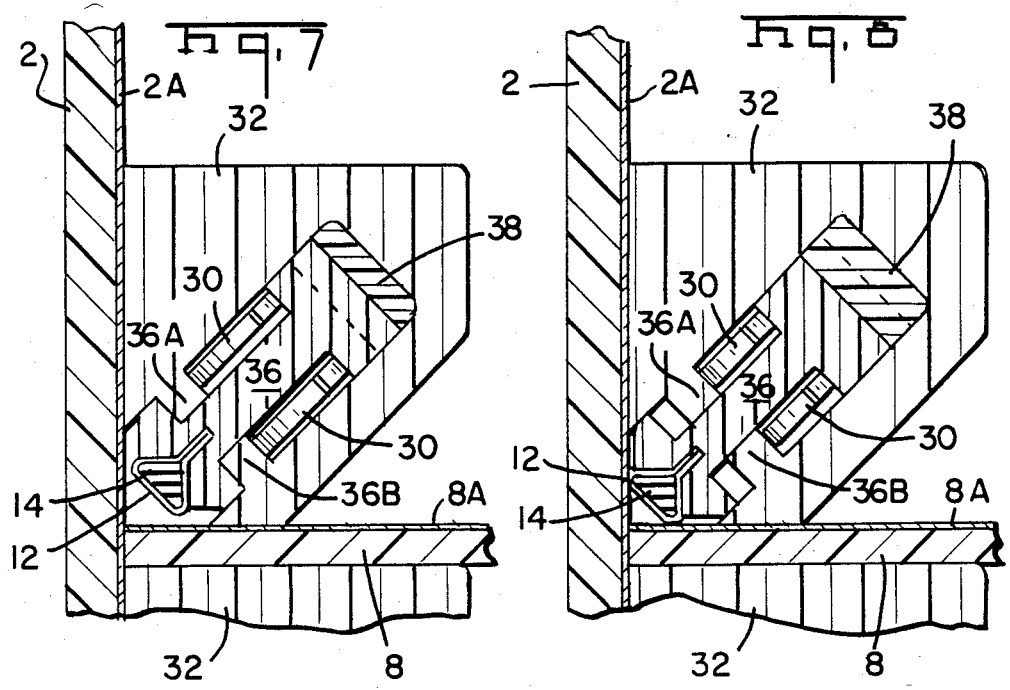
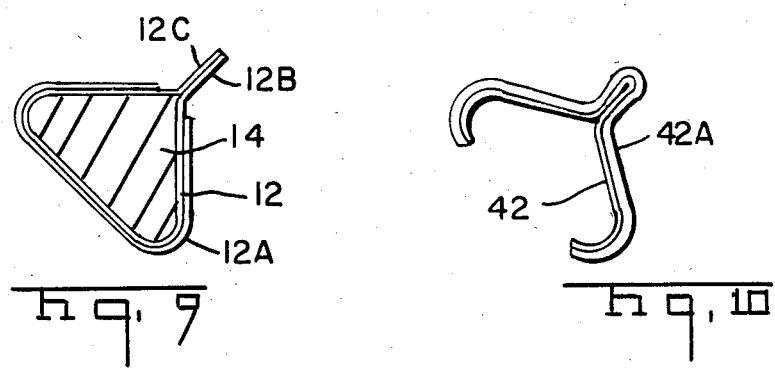
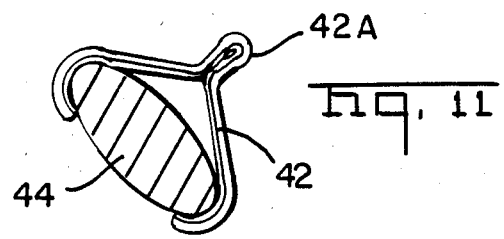

BOARD TO BOARD EDGE CONNECTOR

BACKGROUND OF THE INVENTION

1. Field of the Invention

The present invention relates to an edge connector for use in establishing an electrical connection between discrete paths on orthogonal planar members, and more particularly to an edge connector for establishing surface contact with discrete paths on a printed circuit mother board orthogonally disposed relative to a printed circuit daughter board.

2. Description of the Prior Art

Numerous edge connectors have been employed for establishing electrical integrity between discrete conductive surfaces on orthogonal disposed printed circuit mother boards and printed circuit daughter boards. These connectors have included devices in which the daughter board was mated to the mother board and the full force exerted by the connector was applied to the electrically conductive paths located on the surface of the printed circuit board during interconnection. Other devices have been employed which permitted the daughter board to be mated with the mother board with a low insertion force, which generally corresponded to the exertion of less contact force during mating than during operation of the fully mated circuit boards. In addition to low insertion face connectors, zero force connectors have also been employed. These zero insertion force edge connectors generally employ a camming element which can be activated after the orthogonally disposed printed circuit boards are fully mutually secured.

U.S. Pat. No. 3,609,463 discloses one connector in which the conductive traces on one or more orthogonally disposed boards are connected with electrical paths on a mother board. The connector disclosed therein employs soldered pins on one of the boards to establish contact with the conductive connecting elements in the connector assembly. These electrical conductive connecting paths are disposed on the exterior of a flexible film which is in turn spring biasing into engagement with the conductive traces on the orthogonally inserted and disposed printed circuit board. The connector apparatus described therein does not provide for low or zero insertion force.

U.S. Pat. No. 3,922,054 discloses another printed circuit electrical connector in which conductive paths are disposed on the exterior of a flexible film. A cam actuated spring member controls the application of normal forces on the orthogonally inserted printed circuit daughter board. The flexible circuit used as a connecting element is secured to the mother board at the base of a U-shaped channel by a nut member disposed on the interior of the U-shaped channel. The connecting flat flexible element is thus rigidly secured to the mother board.

U.S. Pat. No. 4,288,139 discloses a card edge terminal connector employing a plurality of discrete spring metal contact elements. A linearly actuated camming member is employed to impart a normal force to the contact elements to make an electrical connection with a printed circuit board. The discrete contact elements are retained in and welded to holes extending through one printed circuit board.

A zero insertion force edge connector for use between a mother board and a daughter board is disclosed in a paper entitled High Density Impedance Control Connectors by A. T. Murphy, B. C. Desal, and F. J. Young distributed on May 15–17, 1984. This connector employs a dielectric film with conductors bonded to the exterior thereof to establish connection between conductive traces on orthogonally disposed mother and daughter boards. The connector contains spring elements secured to a plastic assembly which is transversely inserted and transversely shiftable relative to the orthogonally disposed printed circuit boards.

Although each of these connectors provides for electrical interconnection of orthogonally disposed printed circuit boards, increasingly high density, which can translate into closer spacings between conductive traces on printed circuit boards, the increased demands for greater and greater speed which corresponds to reduced time delay attributable to the connector, and the necessity for mechanically reliable and easily installable and replaceable connector elements foster the need for ever improved edge connectors.

The connector disclosed herein comprises an edge connector which is adapted for use with a connecting element generally as described in U.S. Pat. No. 3,985,413 which comprises a dielectric film having discrete conductors disposed on the exterior thereof, and having elastomeric elements disposed on the interior of the dielectric film to impart resiliency to the element.

SUMMARY OF THE INVENTION

A board to board edge connector for interconnecting discrete laterally disposed electrical traces on the surface of printed circuit boards is disclosed. These traces, which generally include a connecting pad located adjacent at least one edge of the printed circuit board, can be precisely aligned with corresponding traces on an orthogonally positioned board. The connector apparatus consists of a resilient connecting element, which in the preferred embodiment of this invention comprises a dielectric film having discrete conductive paths on the exterior thereof and having a resilient member on the interior of the dielectric film to urge the conductive paths outwardly when the connecting element, is subjected to a normal force. The connecting element is received within a housing which can be secured to one of the orthogonally disposed printed circuit boards. In the preferred embodiment of this invention the housing has a channel which opens transversely towards both orthogonally disposed printed circuit boards so that the conductive path on the exterior of the dielectric film can be shifted into engagement with the conductive paths on both printed circuit boards. At least two camming members are received within the housing and the connecting element is affixed to one of the two camming members. The camming members are laterally mutually shiftable and one of the camming members, to which the connecting element is affixed is also transversely shiftable relative to the printed circuit boards. In the preferred embodiment of this invention the channel defined in the housing has at least one laterally open end such that the camming elements and the connecting member can be easily inserted and removed from the housing, while the printed circuit boards are attached, without removing the housing from either printed circuit board. This allows easy replacement of either the connecting element or the connecting element camming assembly. This ease in replacement is facilitated by the fact that the lateral end of the housing is easily accessible.

BRIEF DESCRIPTION OF THE DRAWINGS

FIG. 2 is an exploded perspective view of the camming elements received within the housing of the connectors and the resilient connecting element.

FIG. 3 is a view of a plurality of connecting assemblies located at the juncture between an orthogonal mother board and daughter boards.

FIG. 4 is a section view of the contact established between the thin film elastomerically biased connecting element and the discrete electrical conductive traces on a daughter board.

FIG. 5 is a sectional view taken along section 5 in FIG. 3, and showing two camming members disposed in a position in which the connecting elements would be spaced from the conductive traces on each of two orthogonal printed circuit board members.

FIG. 6 is a view of the camming elements as shown in FIG. 5 and taken along section 6—6 in FIG. 3, showing camming elements in position to permit the spring to urge the connecting element into contact with the conductive traces on two orthogonal printed circuit boards.

FIG. 7 is a sectional view similar to FIG. 3, but showing an alternate embodiment in which the spring normally biases the connecting element out of engagement with the conductive traces on orthogonal printed circuit boards.

FIG. 8 is a view similar to FIG. 7 in which the cam has been actuated to urge the connecting element into contact with corresponding traces on a printed circuit board.

FIG. 9 is a sectional view of the connecting element of the preferred embodiment of this invention.

FIG. 10 is a view of an alternate embodiment of a connecting element in accordance with this invention employing a metallic spring conductor.

FIG. 11 is a view of another alternate embodiment of this invention employing an elastomeric inner body in conjunction with spring metal contacts.

DESCRIPTION OF THE PREFERRED EMBODIMENTS

Figure 1:
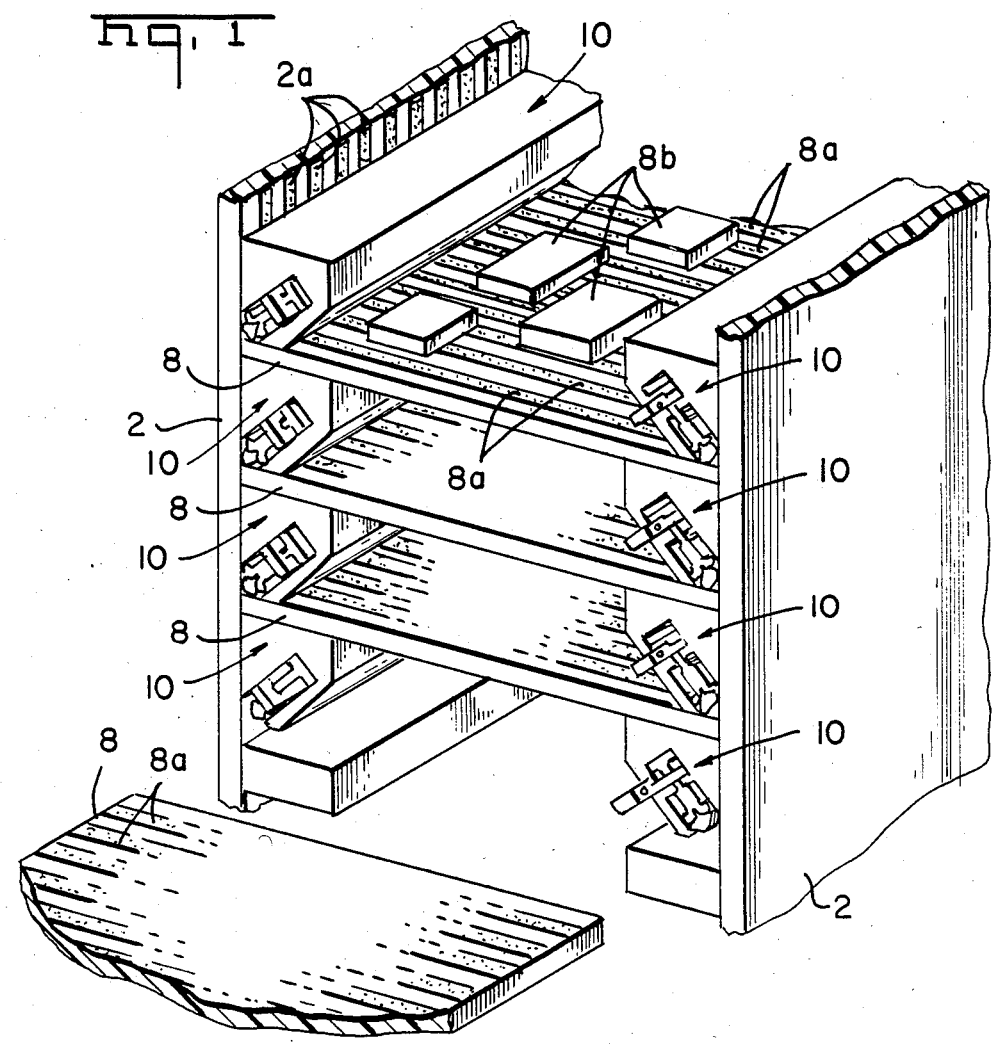
FIG. 1 is a perspective view showing a plurality of daughter boards extending between two mother boards, vertically disposed in a planar array.

An assembly of orthogonal printed circuit boards comprising vertical printed circuit boards 2 and a plurality of horizontally extending daughter boards 8 extending therebetween is shown in FIG. 1. Both the mother and the daughter boards are generally conventional in construction. The vertical mother boards 2 comprise a plurality of discrete laterally spaced conductive paths 2A of conventional construction. Daughter boards 8 also include similar laterally spaced discrete conductive paths 8A leading from the edge of each daughter board to components 8B dispersed on the daughter board surface. The exact nature of the components on the mother boards 2 or the daughter boards 8 is not relevant to the scope of this invention, since the connector apparatus disclosed herein is intended for use with conventional mother and daughter boards. It is however important that the discrete conductive paths 2A and 8A on the mother and daughter boards respectively extend approximate to the position on each board which can be disposed adjacent to the other board. For a conventional daughter board 8, the conductive paths 8A will extend to the edge of the daughter board.

Figure 12:
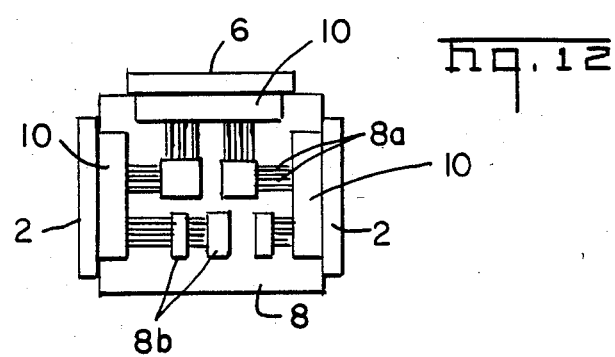
FIG. 12 is a plan view showing a daughter board attached to opposed orthogonal mother boards and an orthogonal back plane.

In the embodiment shown in FIG. 1 a plurality of laterally extending connectors 10 are positioned at the juncture or intersection of mother and daughter boards 2 and 8. In FIG. 1 each connector 10 is mounted to the mother boards 2 by conventional means. In other embodiments of this invention, connectors of this type could be secured to the daughter boards 8. As shown in FIG. 12, the use of connectors 10 is not limited to a configuration in which the connectors are mounted only at two opposite sides of daughter boards 8. FIG. 12 employs three connectors establishing electrical connections between a daughter board and three separate planar members. Two mother boards 2 located on opposite sides of the daughter board shown in FIG. 12 are mated by parallel connectors 10, while a third connector 10 extending along the rear edge of the daughter board 8 establishes an electrical connection with conductive elements on a back plane 6 extending orthogonally to the vertical mother boards 2 and the daughter board 8. Each of the board to board connectors 10 used in the configurations shown in FIG. 1 and FIG. 12 would generally be functionally identical.

Each connector 10 comprises a continuous elongate housing 22 having an uniform cross section along its entire length. Housing 22 could therefore comprise an extruded member formed of an insulating material. A channel 15 extends along the length of the housing 22 and comprises an upper section 15A and a lower section 15B. Longitudinally extending ribs 22A and 22B comprising integral portions of the housing 22 separate the channel 15 into the upper and lower sections 15A and 15B. The longitudinally free ends of the ribs 22A and 22B are spaced from each other such that the ribs 22A and 22B constrict but do not close the longitudinally extending channel 15. When the insulating housing 22 is positioned at the juncture between two planar members, such as a mother board and a daughter board, the channel 15 extends laterally relative to the discrete conductive paths formed on both planar members. The open end of channel 15 at the lower end of the lower channel portion 15B is opposed to the juncture or intersection between orthogonally disposed planar printed circuit boards.

As shown in FIG. 3 multiple connector elements 10 secured to the same mother board 2 can be spaced such that daughter boards 8 can be positioned in a slot defined between vertical adjacent connectors 10. Thus a daughter board 8 can be inserted between the upper surface 22D on one board to board connector 10 and the lower surface 22C on an upper board to board connector 10. Vertically adjacent board to board connectors 10 can be spaced apart by a distance sufficient to permit insertion of a daughter board 8 in the slot defined between surfaces 22C and 22D without the necessity of any significant insertion force being applied to the board 8. In other words, an interference fit would not be established between the daughter board 8 and the surfaces 22C and 22D defining the board receiving slot.

As shown in FIG. 3 a transversely shiftable contact assembly is positionable within the channel 15. This contact assembly comprises a connector member, consisting of the preferred embodiment of a dielectric film 12 having conductive traces 12A disposed on the exterior thereof and a resilient inner core 14, a plunger member 16 on which the connecting element is mounted, a pair of linear cams 18 and a pair of resilient springs 20. This contact assembly is transversely shiftable in channel 15 towards and away from the juncture or intersection between orthogonally disposed planar members such as mother boards 2 and daughter boards 8. The contact assembly is shown in more detail in FIG. 2 which comprises an exploded view of the connecting assembly.

The connecting element or member used in the preferred embodiment of this invention comprises a composite structure in which inherent resiliency is imparted to conductive traces 12A disposed on the dielectric film 12 by an inner extruded elastomeric member 14. In the preferred embodiment of this invention the conductive traces 12A can be closely adjacent and can have line spacings which are less than the similar line spacing between adjacent conductive paths on the printed circuit boards. Indeed the relative spacing between adjacent conductive traces 12A can be easily altered to adapt the specific connector for use with various spacings on the printed circuit board and is therefore easily adaptable to subsequent reduction in the center lines spacing of traces on circuit boards. The dielectric film 12 completely encircles the resilient elastomeric member 14, and the free ends 12B and 12C of the film are continuously disposed at the apex of the triangular shaped resilient element 14. It should be understood that the geometric configuration of the resilient member 14, which imparts configuration to the enveloping dielectric film 12 is not confined to the generally triangular shape shown in FIG. 2.

As shown in FIG. 2 the resilient connecting member is carried on a central carrier 16 which comprises a central camming member flanked by two separate linear camming members 18. The carrier member 16 has a lower connecting element retainer section 16D defining a lower surface having a configuration compatible with composite connecting element assembly. A slot 16E extends into the carrier 16 and receives the two free ends 12B and 12C of the dielectric film 12. Since in the preferred configuration of this embodiment the lower surface of the retainer section 16D engages the respective contact traces 12A on the exterior of the film 12, this portion of the carrier assembly would be formed of a material having suitable electrical insulating properties. Two upwardly facing surfaces 16F define the upper portion of the retainer section of carrier 16 and are located on opposite sides of a central rib 16G forming the main body of carrier 16. A pair of stop shoulders 16H are located along the exterior of rib 16G and are spaced from surfaces 16F. The function of stop shoulders 16F will become apparent in conjunction with the description of the operation of the apparatus. The upper end of rib 16G is essentially T-shaped with a thickened section 16A extending on both sides of the rib 16G. A linear camming surface is formed off the lower surface of the carrier head 16A on opposite sides of rib 16G. This linear camming surface comprises alternate recesses 16B and depending camming teeth 16C each having a slanted surface on one end and a perpendicular surface extending vertically on the opposite end. The carrier 16 is centrally disposed within the channel 15 in housing 22.

A pair of shiftable camming members 18 are disclosed on opposite sides of the central rib 16G of carrier 16. Each of the linear camming members 18 has a complimentary camming surface defined by upstanding camming teeth 18B and recess sections 18A. This camming profile on the exterior camming members 18 is adapted to engage the camming profile formed by surfaces 16B and 16C on the carrier member. As the camming members 18 are move laterally to the carrier 16, engagement of the profile camming surfaces will shift the carrier laterally with respect to the camming members 18. The final element of the contact assembly contained within the channel 15 comprises a pair of wave springs 20 which serve to bias the carrier 16 either towards or away from the transversely or orthogonally disposed planar circuit boards to which the connector 10 is to be assembled. The relative positioning of the contact assembly and the housing 22 can be seen in FIG. 3 which shows contact assembly in various positions relative to daughter boards 8. Thus in the configuration shown in FIG. 3, the springs 20 would tend to bias the carrier 16 and the connecting assembly transversely towards both mother and daughter boards. The linear cams 18 would be disposed on the opposite faces of rail 22A and 22B in the upper portion of 15A of the channel. The flat lower surface of the linear cams 18 would engage the upper surface of rails 22A in the configuration shown in FIG. 3. The enlarged head portions 16A of the carrier 16 would also be contained within the upper section 15A of the channel. The profiled camming surface on the carrier head 16A and the cams 18 would be positioned in engagement in the upper channel section 15A.

In the embodiment shown in FIG. 3 the upper channel section 15A is large enough to contain both the carrier head 16A and the linear cams 18 when the raised or depending surfaces 16C and 18B are in engagement. In this configuration the intercontact assembly is maintained in a position in which the connecting element including traces 12A on the film 12 are transversely spaced from both intersecting printed circuit boards. The upper connector 10 shown in FIG. 3 is in a position with the contact assembly in its deactivated position, thus providing adequate room to insert a daughter board 8 in the slot between housing surface 22C and the top 22D of a lower connector 10. The central connector 10 in FIG. 3 is also shown in the deactivated position with the conductive traces 12A on film 12 spaced from conductive traces on both the mother board 2 and the daughter board 8. The lower connector 10 shown in FIG. 3 is in the extended position in contact with conductive traces on both mother and daughter boards. Transverse movement of the contact assembly and the connector element toward the juncture or intersection of the two planar boards is accomplished by lateral movement of the camming elements 18 relative to the carrier 16. As the cam 18 is moved from the position shown in FIG. 5 to the position 6, the springs 20 acting between housing rails 22A and 22B and surfaces 16F urge the carrier 16 and connecting element into engagement with corresponding conductive traces on boards 2 and 8. With the conductive traces 12A in contact with conductive traces 2A and 8A, as shown in FIG. 4, the resilient body 14 of the connecting element and the springs 20 both exert a force tending to establish intimate surface contact between the connecting elements and corresponding conductive traces on the printed circuit board. If for any reason the contact force supplied by the resilient interbody 14 becomes insufficient to maintain adequate contact force, for example as a result of any creep effects, the spring 20 will be sufficient to apply adequate force.

Although the preferred embodiment of this invention employs spring 20 to urge the contact assembly towards the juncture between intersecting circuit boards and into contact with discrete paths thereon, an alternate embodiment of this invention can be employed in which a spring tends to urge the connector assembly away from the printed circuit boards. FIGS. 7 and 8 show an alternate assembly in which the connecting element is biased away from the conductive paths on the printed circuit board by the action of springs 30. The embodiment of FIGS. 7 and 8 employs a connecting element similar to that shown in the embodiment of FIG. 3 in which a dielectric film 12 having conductive traces thereon is positioned in surrounding relationship to a resilient elastomeric body 14. This connecting element is positioned on a carrier 36 which is contained within an open ended channel similar to that shown in the embodiment of FIG. 3. Rails 36A and 36B divide the channel into upper and lower portions with the camming elements consisting of a linear cam 38 and the upper portion of the carrier 36 positioned in the upper portion of the channel. Camming profiles are located on abutting surface of linear cam 38 and the carrier 36 such that lateral movement of the cam 38 shifts the carrier 36 from the position shown in FIG. 7 to the position shown in FIG. 8. In this embodiment the connecting element is in contact with conductive traces 2A and 8A but the only resilient force reacting on the conductive traces on film 12 is that supplied by the elastomeric body 14. Thus springs 30 would tend to urge the connecting element away from the printed circuit boards.

Further modifications to the embodiment of FIG. 3 are also in the scope of this invention. FIGS. 9 through 11 show three connecting element configuratiions which could be employed with either the embodiment of FIG. 3 or the embodiment of FIGS. 7 and 8. The preferred embodiment of the resilient connecting element is shown in FIG. 9 in which the conductive traces 12A are shown on the exterior of film 12. FIG. 10 discloses a laminate construction in which the conductors comprise a spring member 42A which is secured to the exterior of the dielectric film. The dielectric film serves to maintain the adhesively bonded spring laminates on appropriate center lines spacing. FIG. 11 shows an embodiment similar to FIG. 10 but also including an elastomeric body 44, similar to elastomeric body 14 located on the interior of the film. It should be understood that other resilient connecting elements could also be employed. For example a separate metallic spring can be employed on the inner surface of a film with etched or laminated traces similar to traces 12A employed on the exterior of the film.

Each of the embodiments of this invention is adapted for use with a laterally extending channel 15 having one or more open ends. An open ended channel of this type permits insertion of entire assembly including the connecting element, the carrier 16, cams 18, and the springs 20. This inner assembly can be removed with or without a daughter board 8 in place. This insertion and removal from a single end is made possible by the generally continuous configuration of the entire contact assembly contained within channel 15. Indeed this assembly can be easily manufactured since the components can be extruded or made in some other fashion consistent with elements generally uniform along their respective axis. Indeed long continuous elements such as this can be cut to length for given applications. Furthermore the use of discrete paths on the dielectric film 12, having center lines less than the center lines of the conductive traces on the transversely or orthogonally positioned printed circuit boards permits the connecting element to float relative to the individual traces, especially if the width of the individual traces 12A is less than the width of traces 2A and 8A. Thus precise alignment between the connecting element and dielectric film traces 12A and the printed circuit board traces 2A and 8A is unnecessary. All these features can be combined with an easily actuatable zero or low insertion force connector which permits the conductive traces connecting the element to be moved out of engagement with conductive traces in which they are in registry prior to disengagement of the printed circuit boards. This zero or low insertion force capability is combined in a connector which is capable of very high speeds since the interconnection is made adjacent the intersection of juncture of printed circuit boards and therefore the connecting path is relatively short in length. The surface mount capability of this connector also greatly enhances its versatility as described herein.

Although the invention has been described as employed in several embodiments including a preferred embodiment in which the connecting traces are energized both by a resilient elastomeric member and by a separate spring, other embodiments incorporating the inventive features as claimed herein will be apparent to one skilled in the art. Therefore the invention that is claimed herein is not limited to the specified embodiments disclosed.

What is claimed is:

1. A board to board connector apparatus for interconnecting corresponding electrically conductive paths on transversely disposed planar boards, comprising:
   a longitudinally extending housing attachable to one of the boards and having an opening at one of its longitudinally spaced ends communicating with a longitudinally extending channel in the housing;
   a first camming member longitudinally shiftably disposed in the channel and having a first camming surface thereon:
   a second camming member transversely shiftably disposed in the channel and longitudinally insertable therein having a second camming surface thereon in camming engagement with the first camming surface, longitudinal movement of the first camming member impacting transverse movement of the second camming member substantially perpendicular to the longitudinal extent of the housing toward and away from both planar boards; and
   a laterally disposed resilient connecting element, affixed to the second camming member, juxtaposed to the boards and shiftable into and out of engagement with conductive paths on the boards upon movement of the second camming member towards and away from the boards, whereby discrete paths on the transversely disposed boards are interconnected by longitudinal movement of the first camming member, the camming members being longitudinally insertable through the opening into the housing whereby the camming members can be inserted and removed from the housing while the housing remains attached to the one board.

2. A board to board connector apparatus for interconnecting discrete electrically conductive paths on a mother board to corresponding electrically conductive paths on a daughter board; comprising:
   a laterally disposed resilient connecting element having discrete laterally disposed electrically conductive paths on the exterior thereof disposable in opposition to corresponding electrically conductive paths on both the mother and the daughter boards;

a longitudinally extending housing attachable to one of the mother and daughter boards and having an opening at one of its longitudinally spaced ends: and at least two camming members relatively mutually longitudinally shiftable and longitudinally insertable into the housing through the opening, with the resilient connecting element being affixed to one camming member, relative longitudinal movement between the two camming elements imparting transverse movement of the connecting element and the one camming substantially perpendicular to the longitudinal extent of the housing toward both the mother and daughter boards bringing the discrete conductive paths on the connecting element into surface contact with the corresponding discrete conductive paths on the mother and daughter boards.

3. The apparatus of claim 2 wherein the connecting element comprises a laminate element.

4. The apparatus of claim 3 wherein the connecting element comprises a resilient inner body with a dielectric film disposed at least partially around the exterior of the body, and a plurality of discrete electrically conductive paths disposed on the exterior of the dielectric film.

5. The apparatus of claim 4 wherein the resilient inner body comprises an extruded elastomeric inner body.

6. The apparatus of claim 2 further comprising spring means for biasing the transversely shiftable camming member substantially perpendicular to the longitudinal extent of the housing.

7. The apparatus of claim 6 wherein the spring means biases the transversely shiftable camming member substantially perpendicular to the longitudinal extent of the housing away from the mother and daughter boards.

8. The apparatus of claim 7 wherein the other camming member is longitudinally shiftable relative to the transversely shiftable camming member against the force exerted by the spring means.

9. The apparatus of claim 8 wherein the housing has a channel defined therein having a longitudinally extending open end transversely facing both the mother and daughter boards.

10. The apparatus of claim 9 wherein the two camming members and the spring are located in the channel.

11. The apparatus of claim 10 wherein the two camming members and the spring means are longitudinally insertable and removable into and from the channel through the opening at one end.

12. The apparatus of claim 2 wherein the the connecting element is laterally free to float relative to the discrete electrically conductive paths on the mother and daughter boards when the transversely shiftable camming member is transversely shifted away from the mother and daughter boards.

13. An assembly comprising a plurality of orthogonal planar elements including first and second printed circuit mother boards spaced apart in an opposed planar array, at least one printed circuit daughter board orthogonally disposed between the mother boards and attached thereto, and a back plane orthogonally disposed relative to the printed circuit mother and daughter boards, each of the orthogonal elements having discrete electrically conductive surfaces thereon; the assembly further comprising;

connector members disposed at the junctures between a daughter board and the adjacent orthogonally disposed mother boards and the back plane, each connector member comprising:

a longitudinally extending housing attachable to one of the boards and having an opening at one of its longitudinally spaced ends;

a resilient connecting element disposed in the housing extending parallel to the juncture between two associated elements and having electrically conductive paths on the exterior thereof, disposable in transversely opposed relationship relative to the discrete conductive surfaces;

first and second camming members relatively mutually shiftable parallel to the juncture of the orthogonal elements, the connecting element being securable to one of the camming members and being transversely shiftable relative to the orthogonal elements substantially perpendicular to the longitudinal extent of the housing upon relative movement between the first and second camming members parallel to the juncture between two associated orthogonal elements; and a channel defined in the housing having a first open face adjacent the conductive surfaces on two associated orthogonal elements communicating with the opening, the first and second camming elements being insertable into and removable from the channel through the opening whereby relative movement of the first and second camming members in the channel parallel to the juncture between two associated orthogonal elements moves the connecting element into and out of contact with conductive surfaces on two associated orthogonal elements to establish electrical contact therebetween.

* * * * *